United States Patent [19]

Takano

[11] Patent Number: 5,432,797
[45] Date of Patent: Jul. 11, 1995

[54] IC TESTER HAVING A PATTERN SELECTOR CAPABLE OF SELECTING PINS OF A DEVICE UNDER TEST

[75] Inventor: Kazuo Takano, Saitama, Japan

[73] Assignee: Advantest Corporation, Tokyo, Japan

[21] Appl. No.: 808,709

[22] Filed: Dec. 17, 1991

[30] Foreign Application Priority Data

Dec. 19, 1990 [JP] Japan .................. 2-403627

[51] Int. Cl.$^6$ .................. G11C 29/00; H04B 17/00
[52] U.S. Cl. .................. 371/27; 371/21.1; 371/22.1
[58] Field of Search .......... 371/27, 25.1, 24, 21.2, 371/21.1

[56] References Cited

U.S. PATENT DOCUMENTS

| | | | |
|---|---|---|---|
| 4,768,195 | 8/1988 | Stoner et al. | 371/25 |
| 4,862,460 | 8/1989 | Yamaguchi | 371/21 |
| 4,928,278 | 5/1990 | Otsuji et al. | 371/1 |
| 4,958,346 | 9/1990 | Fujisaki | 371/21.3 |
| 5,127,011 | 6/1992 | Combs et al. | 371/27 |

*Primary Examiner*—Robert W. Beausoliel, Jr.
*Assistant Examiner*—Norman M. Wright
*Attorney, Agent, or Firm*—Staas & Halsey

[57] ABSTRACT

In an IC tester for testing a memory built in a logic IC, a memory test pattern generator includes a waveform control pattern memory and a logical comparison pattern memory, and waveform control pattern data and logical comparison control pattern data from these pattern memories are supplied to a waveform controller and a logical comparator via a pattern selector capable of selectively switching to respective pins of the IC under test.

15 Claims, 8 Drawing Sheets

IC TESTER HAVING A PATTERN SELECTOR CAPABLE OF SELECTING PINS OF A DEVICE UNDER TEST

BACKGROUND OF THE INVENTION

1. Field of the Invention

The present invention relates to an IC tester for testing a logical IC device having at least one memory built therein.

2. Description of the Related Art

Conventional logical IC's have a mainly logical circuits formed therein and there are also logical IC's each having a memory or memories built therein in addition to logical circuits. In these types of IC's, terminals leading to the memory can be all connected to external pins by switching the mode of operation from a logical circuit test mode to a memory test mode. Accordingly, the incorporated memory can be tested independently of the logical circuits by setting the memory test mode.

FIG. 1 (Prior Art) shows the construction of a conventional IC tester for testing IC's of this kind. The IC tester is provided with a logic test pattern generator 10 for generating logic test patterns for testing a logical circuit of an IC 36 under test and a memory test pattern generator 20 for generating memory test patterns for testing a memory. The IC tester is adapted to be switchable between the logical circuit test mode and the memory test mode so as to be able to test the logical circuit and the memory independently of each other.

The logic test pattern generator 10 comprises a logic test pattern memory 10A, a waveform control pattern memory 10B and a logical comparison control pattern memory 10C. The logic test pattern memory 10A has logic test pattern data stored therein for performing a logic test on the IC 36 under test and the pattern data is read out therefrom as logic test pattern data PLA of plural channels which are supplied through OR circuits 61 to a waveform formatter 31. Generally, the number of channels is set to be equal to the number of pins of an IC under test which is deemed to have the largest number of pins among IC's to be tested. The waveform control pattern memory 10B has waveform control pattern data for logic test stored therein and the logic test waveform control pattern data is read out therefrom as logic test waveform control pattern data PB of plural channels which are supplied to a waveform controller 32. The logical comparison control pattern memory 10C has logical comparison control pattern data for logic test stored therein and the logic test logical comparison control pattern data is read out therefrom as logic test logical comparison control pattern data PC of plural channels which are supplied to a logical comparison part 33.

The waveform formatter 31 generates a logical waveform for testing the logical circuit of an IC 36 under test, based on the logic test pattern data PLA read out of the logic test pattern memory 10A and provided via OR circuits 61 and a timing signal TS provided from a timing generator 40. The logical waveform is supplied as a logic test pattern signal to the IC 36 via a group of drivers 35. The waveform control pattern data PB read out of the waveform control pattern memory 10B is input into the waveform controller 32 to effect ON-OFF control of each driver of the driver group 35. That is, when a logic test pattern signal is applied to terminal pins of the IC under test 36, the corresponding drivers are controlled to turn the ON state (i.e. the activated state) and when a response signal is taken out of the IC 36, the driver is controlled to enter the OFF state (i.e. the state of a high output impedance).

The comparison control pattern data PC read out of the logical comparison control pattern memory 10C is input into the logical comparison part 33, wherein it is controlled on a bitwise basis (i.e. for each pin) whether or not to make a comparison between the logic of the response output signal from the IC under test 36, decided by a logic decision comparator group 37, and expected value pattern PD derived from the logic test pattern data PLA. Reference numeral 38 denotes a failure analysis memory for storing the results of logical comparison from the logical comparison part 33.

The timing generator 40 applies the timing signal TS to the waveform formatter 31, the waveform controller 32 and the logical comparison part 33 to time their operations. The timing generator 40 also applies an operating clock CK to a sequence controller 50. Based on the operating clock CK supplied from the timing generator 40, the sequence controller 50 generates a control signal such as a pattern address, which is applied to the test pattern memory 10A, the waveform control pattern memory 10B and the logical comparison control pattern memory 10C to control their readout sequences to read out therefrom the respective pieces of pattern data PLA, PB and PC.

Also in the case of testing a memory in the IC 36, the control signal such as a pattern address, provided from the sequence controller 50, is used to read out the waveform control pattern data PB and the comparison control pattern data PC from the logic test pattern generator 10 and, in this instance, the logic test pattern data PLA is not read out, but instead memory test pattern data PMA is read out of the memory test pattern generator 20 by the same control signal. The memory test pattern data PMA is composed of address pattern data which is applied to the address input pins of the IC under test 36, input data pattern data which is provided to the data input pins of the IC 36 and control pattern data which controls whether to effect a write or read in each test cycle. These pieces of data are respectively provided at predetermined ones of output terminals $Q_0$ to $Q_i$ of the memory test pattern generator 20 irrespective of the pin array of the IC under test 36.

The memory test pattern data PMA is selected by a pattern selector 25, for each pin, in accordance with terminal select addresses set in a pattern select register 26 and is provided via the OR circuit 61 to the waveform formatter 31. The pattern selector 25 is made up of multiplexers $MP_1$ to $MP_n$ provided corresponding to pins $T_1$ to $T_n$ of the IC under test 36 and each having connected thereto all the output terminals $Q_0$ to $Q_i$ of the memory test pattern generator 20. The pattern select register 26 is made up of terminal address registers $R_1$ to $R_n$ connected to control terminals C of the multiplexers $MP_1$ to $MP_n$, respectively. Prior to the test of the IC 36 an address is set in each of the terminal address registers $R_1$ to $R_n$ for specifying any one of the output terminals $Q_1$ to $Q_i$ which is to be selected by each of the multiplexers $MP_1$ to $MP_n$ in accordance with the pin array of the IC 36. Thus, selected pieces of the address pattern data and the input data pattern data are provided to the address and input pins of the IC under test 36 according to the setting of the pattern select register 26. The sequence controller 50 provides to an inhibit terminal INH of the pattern selector 25 a control signal GS which represents whether the test currently under way is a logic test or memory test. When the control signal GS is, for example, a "1" representing a logic test, the pattern selector 25 inhibits all of its outputs, preventing erroneous outputting of signals from the memory test pattern generator 20.

Conventionally, during the memory test, the memory test pattern data PMA selected by the pattern selector 25 for each pin is provided to the waveform formatter 31, and at the same time, the waveform control pattern data PB and the comparison control pattern data PC are provided to the waveform controller 32 and the logical comparison part 33 from the logic test pattern generator 10, effecting waveform control and control of the logical comparison. The waveform control and the logical comparison must be conducted for each pin, and consequently, when the positions of pins for testing a memory differ with the types of IC's to be tested, it is necessary that programs for generating the waveform control pattern data PB and the comparison control pattern data PC be prepared for each type.

In practice, some memory built-in type logic IC devices have such arrangements of terminals as shown in FIGS. 2, through 4. In the IC 36 depicted in FIG. 2 there are arranged memory test address input pins 361 on a side A containing a first pin $T_1$, memory test data output pins 362 on a side B, and memory test data input pins 363 and a read/write control signal input pin 364 on a side D containing a last pin $T_n$. These pins 361 through 364 are connected to a memory 36M incorporated in the IC 36. The other remaining pins are those for a logic circuit 36L shown as an area except the memory 36M in the IC 36.

The IC depicted in FIG. 3 has memory test data I/O pins 365 arranged on the side A containing the first pin $T_1$, the read/write control signal input pin 364 on the side B and the memory test address input pins 361 on the side D.

The IC 36 shown in FIG. 4 has built therein two memories 36M1 and 36M2. In this instance, there are arranged the address input pins 361 of the memory 36M1 and the data I/O pins 365 of the memory 36M2 on the side A, the data output pins 362 of the memory 36M1 and the read/write control signal input pin 364 of the memory 36M2 on the side B and the data input pins 363 and the read/write control signal input pin 364 of the memory 36M1 and the address input pins 361 of the memory 36M2 on the side D.

In the case where the arrangement of pins differs with the types of IC's as mentioned above, it is necessary in the prior art to change the setting of the pattern select register 26 for each type and to prepare pattern generation programs of the waveform control pattern memory 10B and the logical comparison control pattern memory 10C for each type. This inevitably calls for increased storage capacities of the test pattern memory 10B and the logical comparison control pattern memory 10C. Besides, it is troublesome to manage the pattern generation programs prepared for each type of the IC to be tested.

SUMMARY OF THE INVENTION

It is therefore an object of the present invention to provide an IC tester which permits reduction of the overall storage capacity of the logic test pattern generator and allows ease in the management of pattern generation programs.

According to the present invention, the memory test pattern generator includes a memory test pattern generation part, a waveform control pattern data memory part and a logical comparison control pattern memory part. Memory test pattern data, waveform control pattern data and logical comparison control data from the memory test pattern generation part, the waveform control pattern data memory part and the logical comparison control pattern memory part are respectively selected by pattern selectors for each pin of an IC under test and provided to the waveform formatter, the waveform controller and the logical comparison part.

With the arrangement of the present invention, since the waveform control pattern data and the logical comparison control pattern data can be selected by the pattern selectors for each pin and then output, programs in the memory test pattern generator for the generation of the memory test pattern data, the waveform control pattern data and the logical comparison control pattern data can be produced independently of the arrangement of pins of the IC under test. Consequently, programs for the generation of pattern data in the memory test pattern generator need not be prepared for each type of the IC to be tested. This affords reduction of the capacities of the memories forming the logic test pattern generator.

DESCRIPTION OF THE PREFERRED EMBODIMENTS

Figure 1:
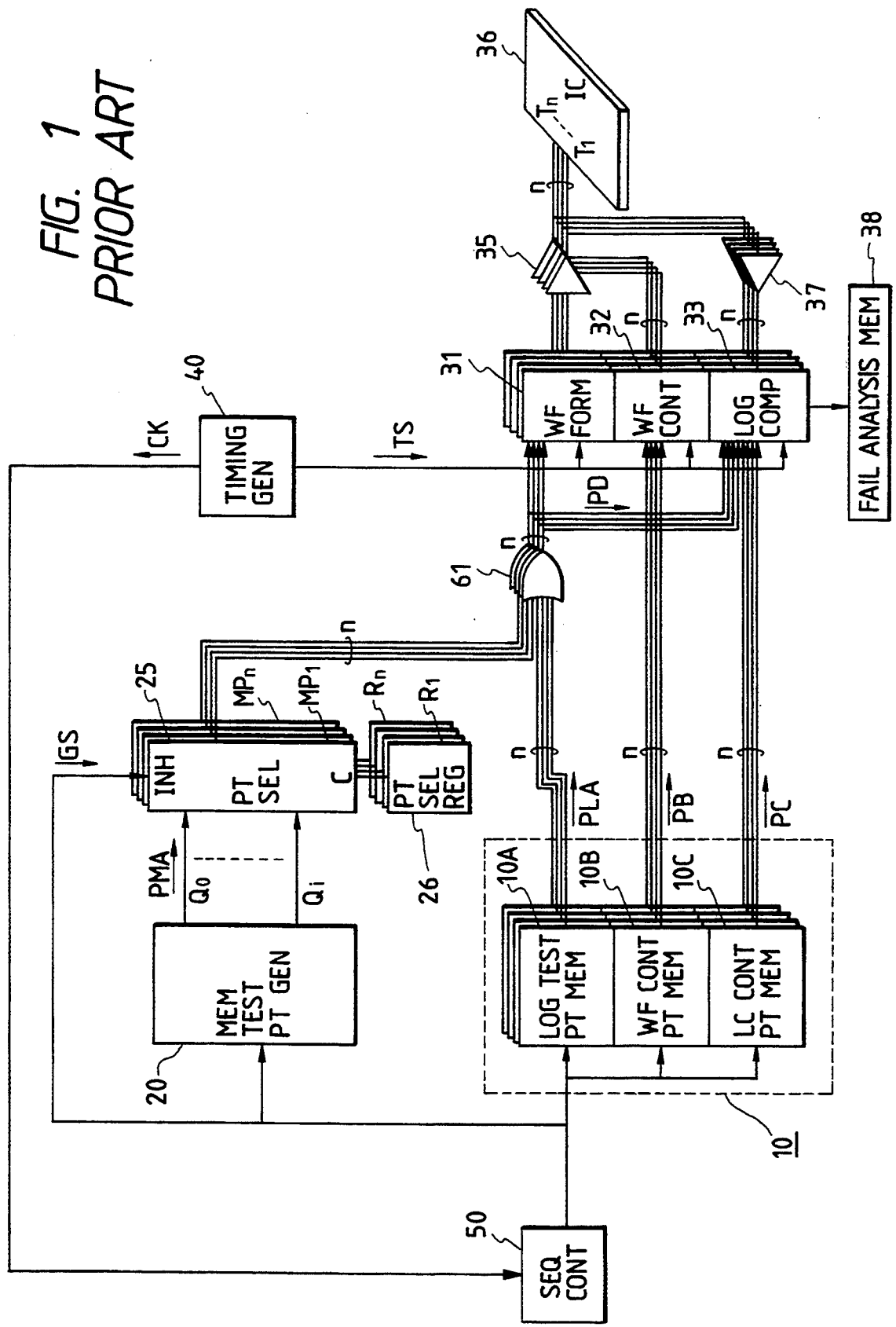
FIG. 1 ("Prior Art") is a block diagram for explaining the prior art.
Figure 2:
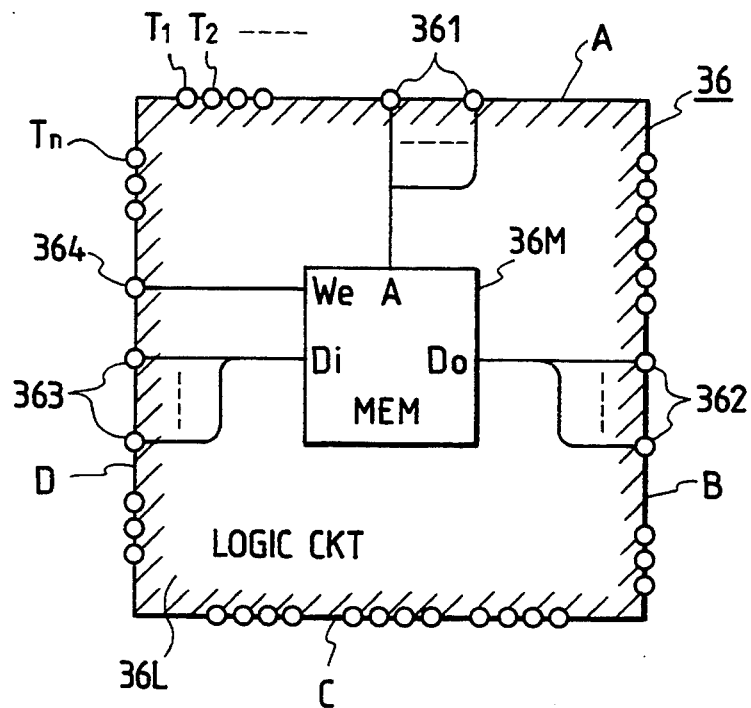
FIG. 2 is a block diagram for explaining the internal construction of a memory built-in type logic IC.
Figure 3:
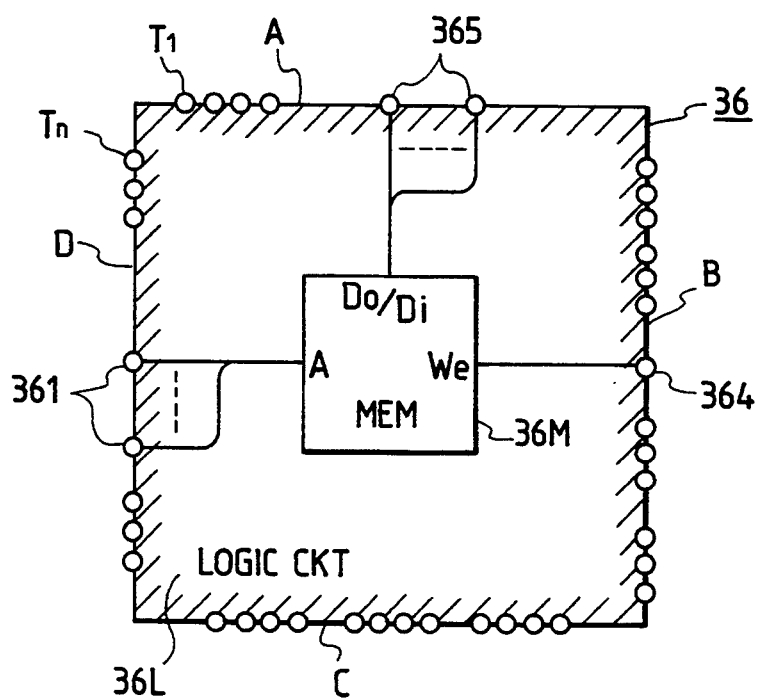
FIG. 3 is a block diagram for explaining the internal construction of another memory built-in type logic IC.
Figure 5:
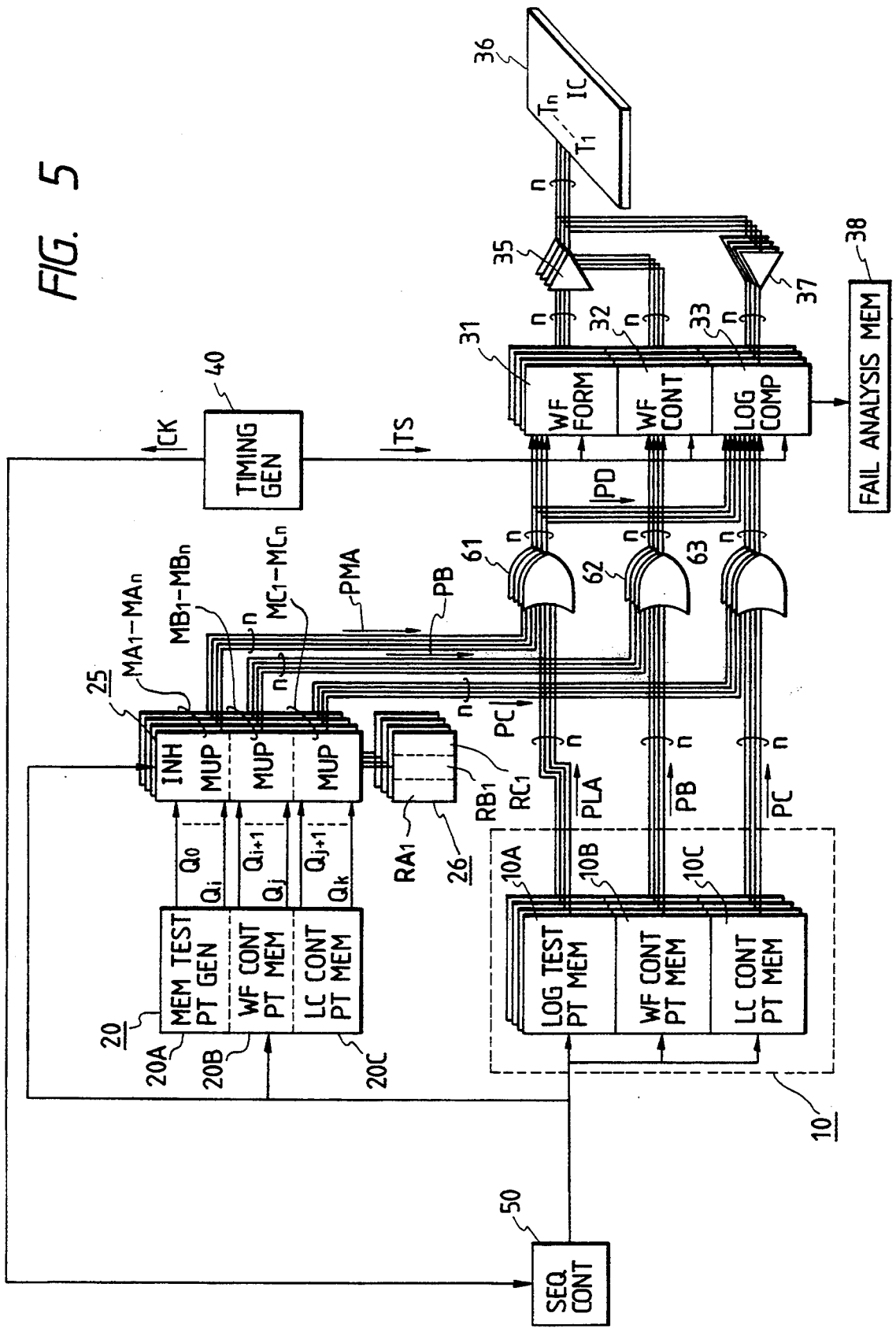
FIG. 5 is a block diagram illustrating an embodiment of the present invention.

FIG. 5 illustrates in block form an embodiment of the present invention. As is the case with the prior art example of FIG. 1, this embodiment includes the logic test pattern generator 10, the memory test pattern generator 20, the pattern selector 25, the pattern select register 26, the waveform formatter 31, the waveform controller 32, the logical comparison part 33, the driver group 35, the IC under test 36, the logic decision comparator group 37, the timing generator 40 and the sequence controller 50. These pieces of data PMA, PB, PC and PLA are each output over n channels in anticipation of an IC which is assumed to have the largest number n of pins among IC's to be tested. For example, the driver group 35 includes n drivers accordingly and the logic decision comparator group 37 is also made up of n comparators. All the other constituent elements 25, 26, 31, 32, 33, 61, 62 and 63 are also provided in units of n channels. The constituent elements are interconnected via n channel lines.

In the present invention the memory test pattern generator 20 comprises a memory test pattern generation part 20A, a waveform control pattern memory 20B and a logical comparison control pattern memory 20C. As in the prior art example of FIG. 1, the memory test pattern generation part 20A generates the memory test pattern data PMA composed of address and data patterns to be provided to the IC under test, and the waveform control pattern data PB and the comparison control pattern data PC are read out of the waveform control pattern memory 20B and the logical comparison control pattern memory 20C, respectively. These pieces of data PMA, PB and PC are provided at output terminals $Q_0$ to $Q_i$, $Q_{i+1}$ to $Q_j$ and $Q_{j+1}$ to $Q_k$, respectively.

The pattern selector 25 is formed by a multiplexer group including three multiplexers $MA_h$, $MB_h$ and $MC_h$ (where $h=1, 2, \ldots, n$) for each channel. The multiplexer $MA_h$ has connected to its input all the output terminals $Q_0$ to $Q_i$ of the memory test pattern generation part 20A, the multiplexer $MB_h$ has connected to its input all the output terminals $Q_{i+1}$ to $Q_j$ of the waveform control pattern memory 20B and the multiplexer $MC_h$ has connected to its input all the output terminals $Q_{j+1}$ to $Q_k$ of the logical comparison control pattern memory 20C. The pattern select register 26 is formed by a register group including three registers $RA_h$, $RB_h$ and $RC_h$ for each channel. In the registers $RA_h$, $RB_h$ and $RC_h$ terminal select addresses SAah, SAbh and SAch are set for selectively connecting one of the terminals $Q_0$ to $Q_i$, one of the terminals $Q_{i+1}$ to $Q_j$ and one of the terminals $Q_{j+1}$ to $Q_k$ to the multiplexers $MA_h$, $MB_h$ and $MC_h$ corresponding to the registers $RA_h$, $RB_h$ and $RC_h$, respectively. The terminal select addresses are provided as terminal select control signals to the multiplexers $MA_h$, $MB_h$ and $MC_h$. When the control signal GS applied from the sequence controller 50 to the inhibit terminal INH of the pattern selector 25 is a "1" representing that the logic test is under way, the pattern selector 25 inhibits its all outputs.

During the memory test, the memory test pattern data PMA, the waveform control pattern data PB and the comparison control pattern data PC are output from the memory test pattern generation part 20A, the waveform control pattern memory 20B and the logical comparison pattern memory 20C, respectively. These pieces of data PMA, PB and PC are selected by the pattern selector 25 for each channel in accordance with the terminal select addresses SAah, SAbh and SAch set in the pattern select register 26, and the memory test pattern data PMA thus selected for each channel is input into the waveform formatter 31 via the OR circuit 61. In the waveform formatter 31, the memory test pattern data PMA and the timing signal TS from the timing generator 40 are used to produce a memory test pattern signal in an actual waveform as in the prior art, and the memory test pattern signal is applied via the driver group 35 to the corresponding channel of the IC under test 36. At the same time, the waveform control pattern data PB and the comparison control pattern data PC are sorted by the pattern selector 25 for each pin and are supplied to the waveform controller 32 and the logical comparison part 33 in the channel corresponding to the desired pin.

As described above, according to the present invention, it is possible to determine, by the setting of the pattern select register 26, which signal is applied to which pin of the IC under test 36. Thus pattern data for the memory test to be conducted alone, irrespective of the pin arrangement of the IC 36, needs only to be stored in each of the waveform control pattern memory 20B and the logical comparison control pattern memory 20C of the memory test pattern generator 20 and different test pattern data need not be used for each type of the IC under test. Accordingly, the waveform control pattern memory 20B and the logical comparison control pattern memory 20C of the memory test pattern generator 20 may be small in capacity. On the other hand, since the waveform control pattern data PB and the logical comparison control pattern data PC for executing the memory test need not be stored in the logic test pattern generator 10, the capacities of the waveform control pattern memory 10B and the logical comparison control pattern memory 10C can be reduced substantially.

Figure 6:
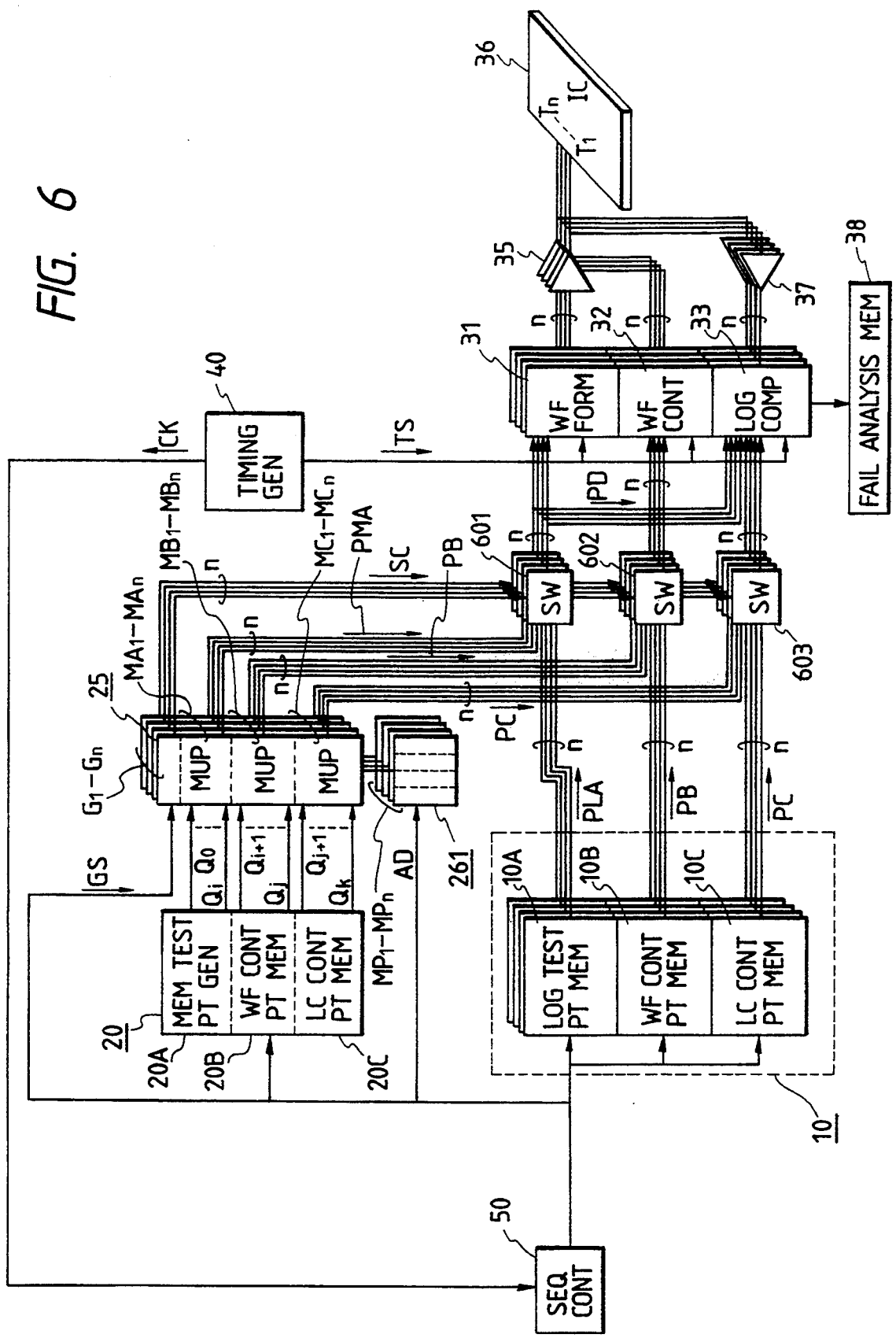
FIG. 6 is a block diagram illustrating a modified form of the present invention.
Figure 7:
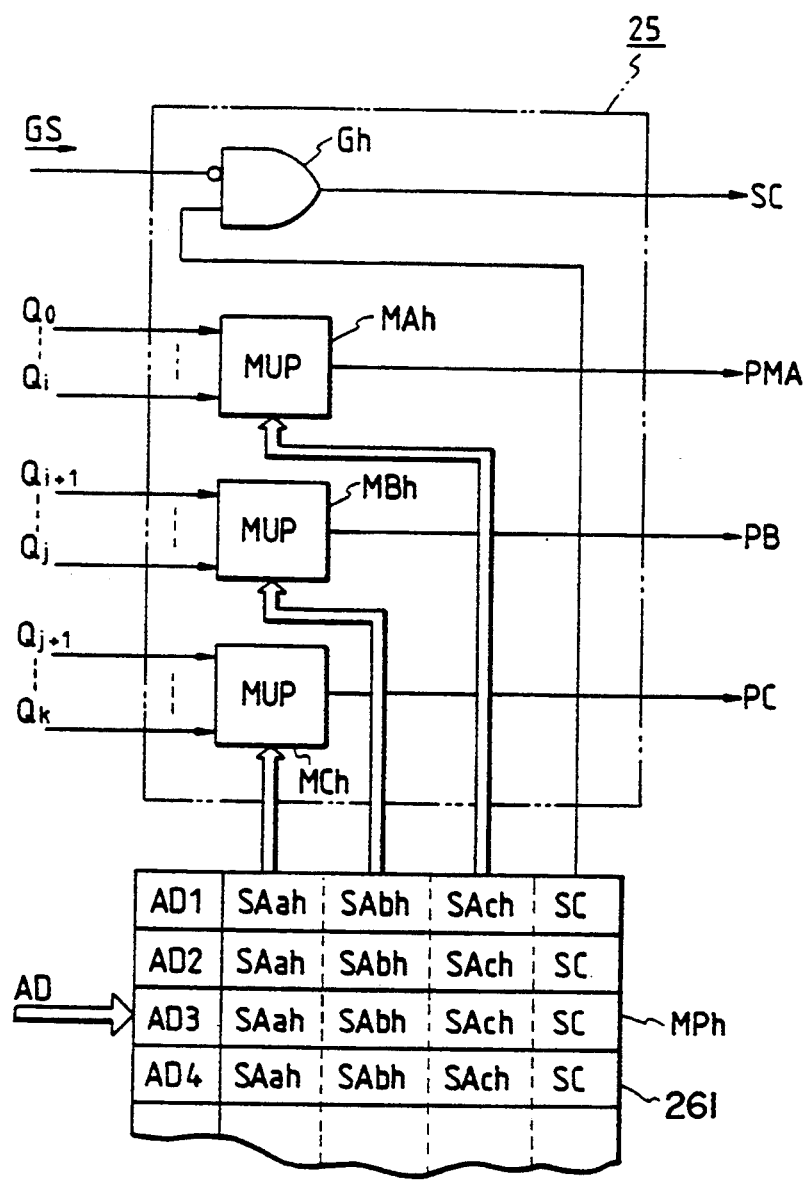
FIG. 7 is a block diagram showing a pattern selector and a pattern select memory in an h-th channel in the embodiment of FIG. 6.

FIG. 6 illustrates a modified form of the present invention. In this embodiment the pattern select register 26 in the FIG. 5 embodiment is substituted with a pattern select memory 261 and an address AD is produced by the sequence controller 50 and is used to access the pattern select memory 261 to read out therefrom three terminal select addresses for each channel, by which the selective connections of the multiplexers $MA_h$, $MB_h$ and $MC_h$ of the pattern selector 25 are controlled. The pattern select memory 261 has n memory planes $MP_1$ to $MP_n$ which are accessed by the common address AD. As seen from FIG. 7 which shows the multiplexers $MA_h$, $MB_h$ and $MC_h$ and the memory plane $MP_h$ corresponding to the h-th channel, there are stored in the memory planes $MP_1$ to $MP_n$ of each channel at addresses AD1, AD2, . . . , corresponding to the type of the IC the terminal select addresses SAah, SAbh and SAch for setting the selective connections of the three multiplexers $MA_h$, $MB_h$ and $MC_h$ for each channel in accordance with the pin arrangement of the IC. With such a construction, by providing the address AD corresponding to the type of the IC 36 from the sequence controller 50 to the pattern select memory 261, it is possible to set therein the selective connections of the multiplexers $MA_h$, $MB_h$ and $MC_h$ corresponding to the pin arrangement of the IC 36.

Figure 4:
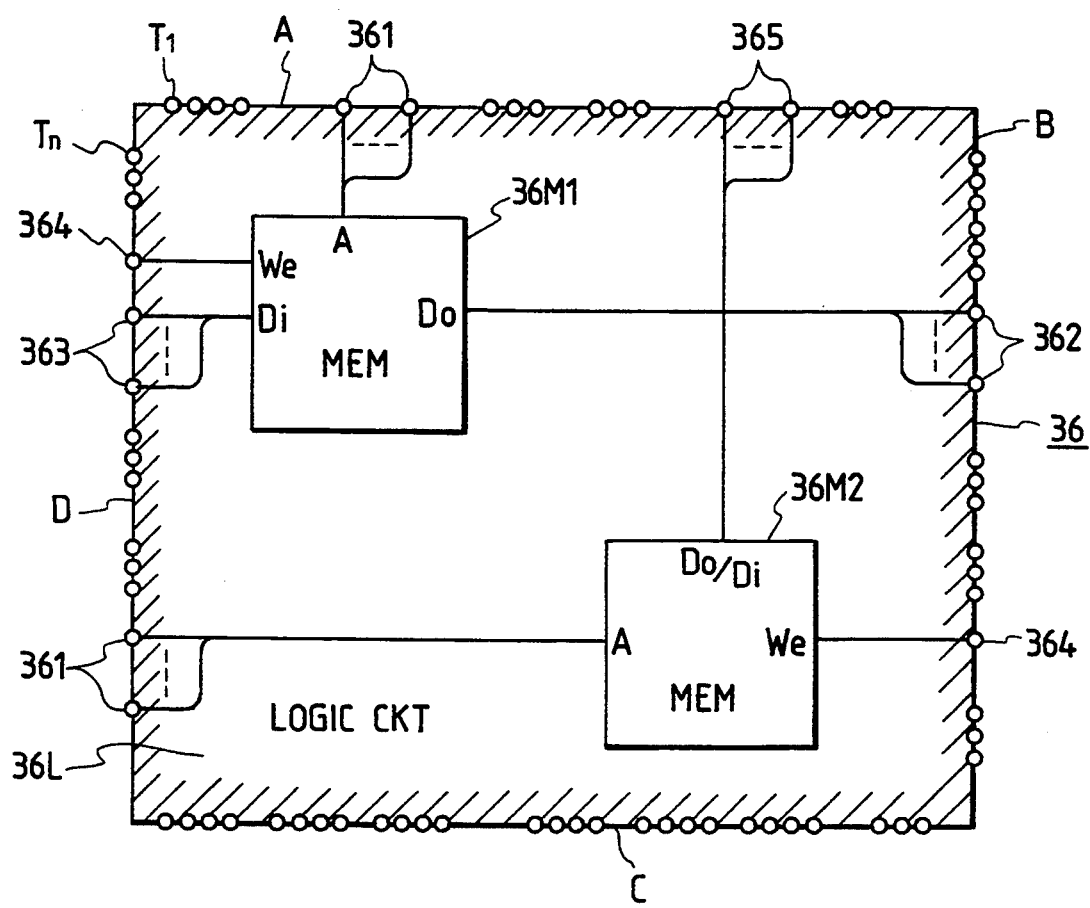
FIG. 4 is a block diagram for explaining the internal construction of still another memory built-in type logic IC.

By storing different pieces of terminal select address data in the pattern select memory 261 at a plurality of addresses, it is possible to change the address AD from the sequence controller 50 to thereby change the terminal select address data which is read out of the pattern select memory 261. Accordingly, the terminal select state of the pattern selector 25 can be switched in a desired step in the test sequence. Thus, the two memories 36M1 and 36M2 of different pin arrangements, built in the IC as shown in FIG. 4, can be tested successively at high speed.

The IC 36 may sometimes have a construction in which the address and data are alternately input into the memory 36M via common input pins and are latched in a memory address latch and a memory data latch alternately with each other. Also in such a case, according to the FIG. 6 embodiment, the pin connection can be switched as required during the generation of a test pattern. In some cases, the IC 36 may have a construction in which only one input pin is provided for each of the address and the data to be supplied to the memory 36M and the address and data are input serially into an address register and a data register, respectively. In the memory test of such an IC, parallel addresses and parallel data are respectively converted into serial form by sequentially changing the selective terminal connection in the pattern selector 25 and are each provided to one channel lines corresponding to each of the address input pin and the data input pin. This can be done by sequentially switching those of the inputs to the multiplexers of the two channels which correspond to the parallel addresses and the parallel data.

In the embodiment of FIG. 6 the pieces of pattern data PLA, PB and PC from the logic test pattern generator 10 and the pieces of pattern data PMA, PB and PC from the memory test pattern generator 20 are switched by switching circuits 601, 602 and 603 for each channel in response to a switching control signal SC and then provided to the waveform formatter 31, the waveform controller 32 and the logical comparison part 33. The control signal GS from the sequence controller 50 is applied to all of n gates $G_1$ to $G_n$ provided in the pattern selector 25 to enable and disable them during the memory test and during the logic test. As is evident from FIG. 7 in which the memory plane $MP_h$ corresponding to the h-th channel is shown, there are stored in the pattern select memory 261 the switching control data SC for switching control of the switching circuits 601, 602 and 603 for each channel as well as the terminal select addresses SAah, SAbh and SAch. The switching data SC read out of the pattern select memory 261 is provided to the switching circuits 601, 602 and 603 via the gates $G_1$ to $G_n$ which are enabled only during the memory test. During the logic test the outputs SC of the gates $G_1$ to $G_n$ are, for example, all "0's," by which all the channels of the switching circuits 601, 602 and 603 are connected to the side of the logic test pattern generator 10. During the memory test the channels corresponding to the switching circuits 601, 602 and 603 are connected to the logic test pattern generator 10 or memory test pattern generator 20, depending on whether the switching control data SC set in each of the memory planes $MP_1$ to $MP_n$ is a "0" or "1."

Figure 8:
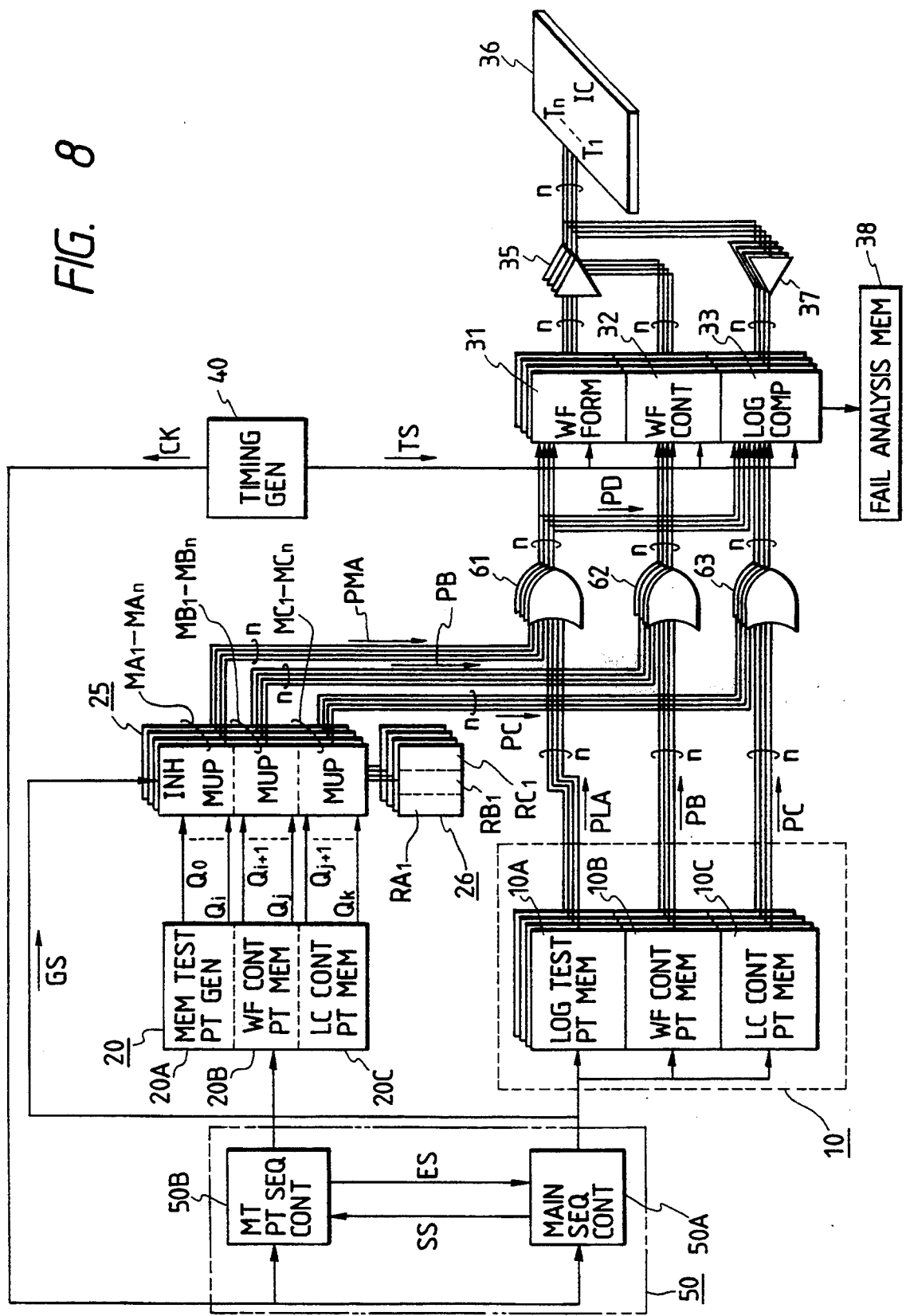
FIG. 8 is a block diagram illustrating another embodiment of the present invention.

FIG. 8 illustrates a modified form of the FIG. 5 embodiment. The sequence controller 50 in FIG. 5 is made up of a main sequence control part 50A which operates in accordance with the common operating clock CK from the timing generator 40 and a memory test pattern sequence control part 50B. In the case of an IC having a memory built therein, the logic part and the memory part are each tested after completion of the test of either one of them. Alternatively, the memory test is conducted for each area of the memory and consequently for each sequence of patterns and the logic test is also conducted for each sequence of patterns; in this case, the memory test and the logic test for each sequence of patterns are made alternately with each other. The test sequence is placed under control of the sequence controller. In this embodiment the main sequence control part 50A applies a start signal SS to the memory test pattern sequence control part 50B upon completion of the test of the logical circuit part (not shown) of the IC by a series of patterns. The memory test pattern sequence control part 50B responds to the start signal SS to execute a program portion for generating a series of memory test patterns, by which the memory test pattern generator 20 is controlled to make the memory test by the series of patterns. Upon completion of the execution of the program portion for generating the series of patterns, the memory test pattern sequence control part 50B applies an end signal ES to the main sequence control part 50A and stops the execution of the memory test pattern generation program. When supplied with the end signal ES, the main sequence control part 50A executes again the program portion for generating a series of logic test patterns for the logic test. Thereafter, the logic test and the memory test are repeated using the same procedure until all the necessary tests of the IC are completed.

In the embodiment of FIG. 8 the logic test pattern generation program for the main sequence control part 50A may be created taking into account only the step in which to conduct the memory test and the contents of the memory test to be conducted in the step need not be taken into consideration. The memory test pattern generation program for the memory test pattern sequence control part 50B may be created taking into account only the contents of the memory test to be conducted. This allows ease in the production of the pattern generation programs for the IC test. Moreover, since during the memory test the logic test pattern generator 10 can be operated by a different sequence, it is possible to operate the logical circuit of the IC under test simultaneously with its memory to test the influence of the former on the latter and to test an IC of a construction in which no memory test can be conducted unless a signal is applied to the pin for logical circuit use in a certain sequence.

In the embodiment of FIG. 8 the sequence controller 50 in the embodiment of FIG. 5 is modified, and it is apparent that the sequence controller 50 in the embodiment of FIG. 6 can similarly be modified.

Figure 9:
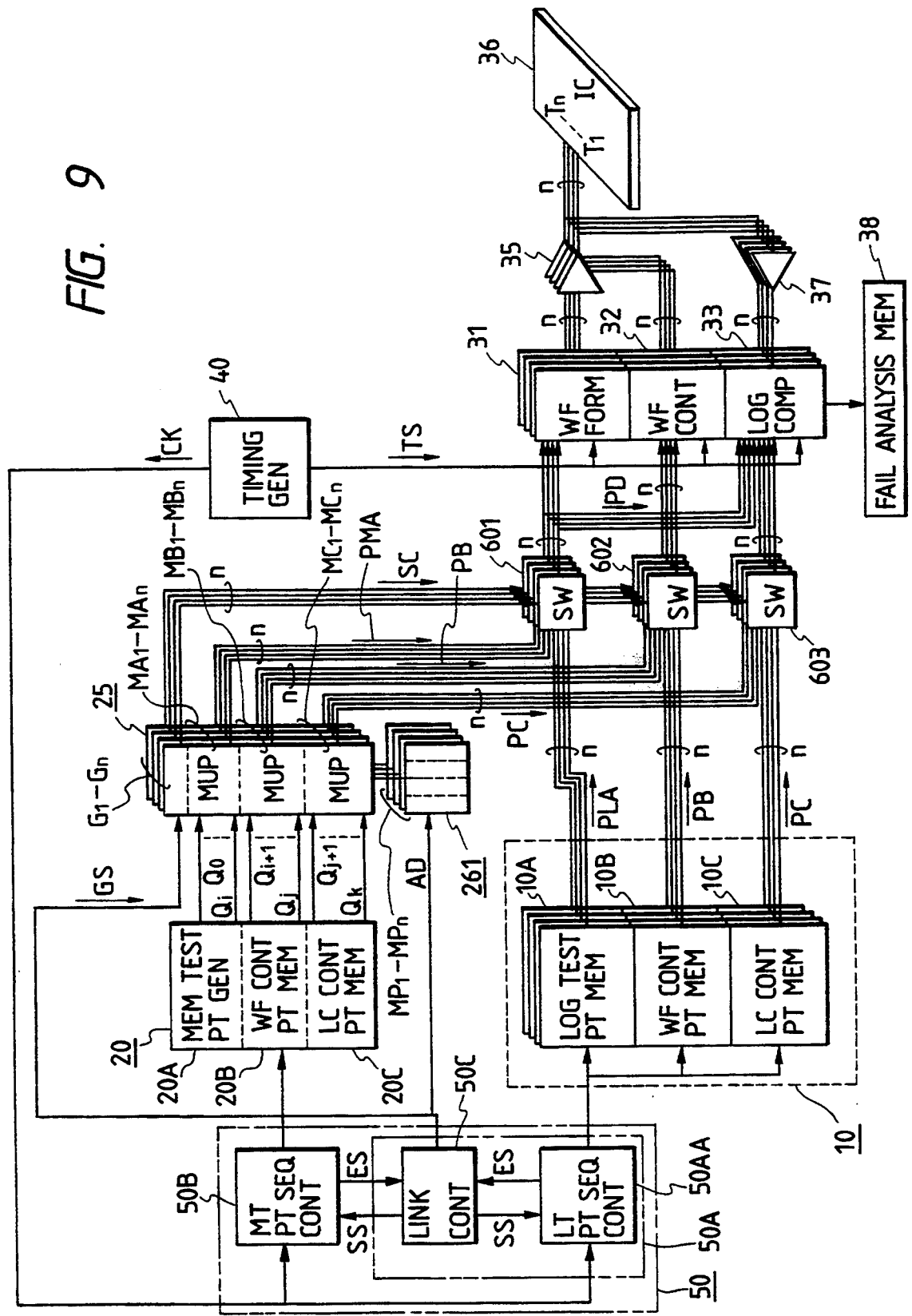
FIG. 9 is a block diagram illustrating still another modification of the present invention.

FIG. 9 illustrates another embodiment of the present invention in which a further modification of the main sequence control part 50A in FIG. 8 is applied to the embodiment of FIG. 6. In this embodiment the main sequence control part 50A comprises a logic test pattern sequence control part 50AA and a link control part 50C connected thereto. The link control part 50C is also connected to the memory test pattern sequence control part 50B. The link control part 50C applies the pattern generation start signal SS to the sequence control parts 50AA and 50B in a predetermined order and, at the same time, supplies the pattern selector 25 with the control signal GS which represents whether the memory test or logic test is to be conducted. When supplied with the pattern generation start signal SS, the sequence control parts 50AA and 50B each execute a program portion for generating a series of patterns and, upon completion of the pattern generation, apply the end signal ES to the link control part 50C. Thus, the pattern generation program for the logic test pattern sequence control part 50AA can be produced without regard to the memory test. A sequence control program for the link control part 50C defines only the order of steps for conducting the memory test and the logic test in a series of test sequence, and hence the program can be created with more ease.

In the above, when the IC under test 36 is a high-speed IC, its input and output pins are often provided for the exclusive use therefor, and in this instance, the ON/OFF state of the driver 35 is not changed for each test cycle in a series of tests. That is, there is no need of generating waveform control pattern data by use of the logic test pattern generator 10 and the memory test pattern generator 20 but instead fixed n-bit data for specifying the ON/OFF state of each driver 35 corresponding to the type of the IC 36 is set in a register (not shown) provided in the waveform controller 32, and during the test of the IC 36 the n-bit data is provided to a control terminal of the driver 35 to fixedly control its ON/OFF state. In test equipment for testing such high-speed IC's, it is possible to omit the waveform control pattern memories 10B and 20B, the multiplexers $MB_1$ to $MB_n$, the OR circuit 62 and the switching circuit 602 used in the embodiments of FIGS. 5, 6, 8 and 9.

As described above, according to the present invention, since the waveform control pattern and the logical comparison pattern for the memory test are obtained by reading them out of the test pattern generator 20, the waveform control pattern memory 10B and the logical comparison pattern memory 10C in the logic test pattern generator 10 are required to store only the pattern generation program for the logic test and a program for generating patterns which are provided to pins for exclusive use of the logic circuit during the memory test—this affords reduction of the capacities of memories forming the waveform control pattern memory 10B and the logical comparison control pattern memory 10C.

Besides, since the present invention employs the construction in which the selection of pins is controlled by the pattern selector 25, a set of test patterns needs only to be stored in the waveform control pattern memory 20B and the logical comparison control pattern memory 20C of the memory test pattern generator 20 independently of the pin arrangement of the IC under test. Hence, the waveform control pattern memory 20B and the logical comparison control pattern memory 20B can be formed by small-capacity memories.

What is claimed is:

1. An IC tester to test an IC, said IC having a logical circuit part, a memory part, and a plurality of pins to which at least one of a logic test pattern data for testing said logical circuit part and a memory test pattern data for testing said memory part is applied, said IC tester comprising:

a memory test pattern generator including memory test pattern generating means for generating said memory test pattern data for testing said memory part of said IC, waveform control pattern memory means for storing waveform control pattern data which are read out on one or more output terminals thereof and which are used to test said memory part, and logical comparison control pattern memory means for storing logical comparison control pattern data which are read out on one or more output terminals thereof and which are used to test said memory part; and pattern selector means for classifying said waveform control pattern data read out from said waveform control pattern memory means and said logical comparison control pattern data read out from said logical comparison control pattern memory means for each of said pins of said IC according to a pin arrangement of said IC, and for providing classified waveform control pattern data for each of said pins and classified logical comparison control pattern data for each of said pins to a waveform control device and a logical comparison device, respectively, to selectively provide said classified waveform control pattern data and said classified logical comparison control pattern data to channels connected to said waveform control device and said logical comparison device and corresponding to desired pins of said IC.

2. An IC tester to test an IC having a logical circuit part, a memory part, and n pins to which at least one of a logic test pattern data and a memory test pattern data is applied, where n is an integer greater or equal to 2, said IC tester comprising:

logic test pattern generating means for generating said logic test pattern data of n channels for performing a test on said logical circuit part of said IC;

memory test pattern generating means for generating said memory test pattern data of m channels for performing a test on said memory part of said IC, where m is an integer and $2 < m < n$, said memory test pattern generating means including a memory test pattern generator, having a plurality of output terminals, which generates on said output terminals said memory test pattern data for performing said test on said memory part of said IC, and further including a logical comparison control pattern memory which stores logical comparison control pattern data for use in testing said memory part of said IC, said stored logical comparison control pattern data being read-out on at least one output terminal of said logical comparison control pattern memory;

pattern selector means, connected to said output terminals of said memory test pattern generator and to said at least one output terminal of said logical comparison control pattern memory of said memory test pattern generating means, for selectively outputting said memory test pattern data supplied thereto to a first set of m channels connected thereto as memory test pattern data of m channels and said logical comparison control pattern data supplied thereto to a second set of m channels connected thereto as logical comparison control pattern data of m channels in accordance with a pin arrangement of said IC; and pattern selection setting means of m channels for setting the selection of said memory test pattern data and the selection of said logical comparison control pattern data with respect to said first and second sets of m channels by said pattern selector means.

3. The IC tester according to claim 2, wherein said memory test pattern generating means further includes a waveform control pattern memory which stores waveform control pattern data for use in testing said memory part of said IC, said stored waveform control pattern data being read out on at least one output terminal of said waveform control pattern memory, said pattern selector means further selectively outputs said waveform control pattern data supplied thereto to a third set of m channels connected thereto as waveform control pattern data of m channels in accordance with the pin arrangement of said IC, and said pattern selection setting means further sets the selection of said waveform control pattern data with respect to said third set of m channels by said pattern selector means.

4. The IC tester according to claim 3 wherein said logic test pattern generating means further includes a waveform control pattern memory which stores waveform control pattern data for use in testing said logical circuit part of said IC and which outputs said waveform control pattern data of n channels and further includes a logical comparison control pattern memory which stores logical comparison control pattern data for use in testing said logical circuit part of said IC and which outputs said logical comparison control pattern data of n channels, said IC tester further comprising:

waveform formatter means of n channels for generating logical waveforms of n or m channels at a predetermined time period and phase or timing, based on one of said logic test pattern data of n channels and said memory test pattern data of m channels supplied thereto, and correspondingly outputting said logical waveforms to n channels connected thereto as a test waveform signal of n or m channels;

driver means of n channels for controlling said test waveform signal of n or m channels supplied thereto whether or not said test waveform signal is outputted therefrom for each channel, based on said waveform control pattern data of n or m channels supplied thereto from a corresponding one of said logic test pattern generating means and said memory test pattern generating means, said driver means of n channels applying said test waveform signal of n or m channels controlled thereby to corresponding pins of said IC; and logical comparison means for logically comparing a response signal of n or m channels outputted from said IC in response to said applied test waveform signal of n or m channels with said test pattern data of n or m channels supplied from said corresponding one of said logic test pattern generating means and said memory test pattern generating means for respective channels specified by said logic comparison control pattern data of n or m channels supplied thereto from said corresponding one of said logic test pattern generating means and said memory test pattern generating means.

5. The IC tester according to claim 4 wherein said logic test pattern generating means further includes a logic test pattern memory for storing said logic test pattern data and outputting said logic test pattern data of n channels therefrom, and said IC tester further comprises:

first gate means for selectively outputting one of said memory test pattern data of m channels and said logic test pattern data of n channels supplied thereto from said memory test pattern generator and said logic test pattern memory, respectively, to said waveform formatter means of n channels and said logic comparison means through a first set of n channels connected to said first gate means;

second gate means for selectively outputting one of said waveform control pattern data of m channels and waveform control pattern data of n channels supplied thereto from said memory test waveform control pattern memory and said logic test waveform control pattern memory, respectively, to control said driver means of n channels through a second set of n channels connected to said second gate means; and third gate means for selectively outputting one of said memory test logical comparison control pattern data of m channels and said logic test logical comparison control pattern data of n channels supplied thereto from said memory test logical comparison control pattern memory and said logic test logical comparison control pattern memory, respectively, to control the logical comparison operation of said logical comparison means of n channels through a third set of n channels connected to said third gate means.

6. The IC tester according to claim 5, wherein said pattern selector means of m channels includes:

a first multiplexer group including multiplexers of m channels, each said multiplexer having all of its inputs correspondingly supplied with outputs of said memory test pattern generator and selectively outputting a desired one of the outputs supplied from said memory test pattern generator to its output, a second multiplexer group including multiplexers of m channels, each said multiplexer having all of its inputs correspondingly supplied with outputs of said memory test waveform control pattern memory and selectively outputting a desired one of the outputs supplied from said memory test waveform control pattern memory to its output, and a third multiplexer group including multiplexers of m channels, each said multiplexer having all of its inputs correspondingly supplied with outputs of said memory test logical comparison control pattern memory and selectively outputting a desired one of the outputs supplied from said memory test logical comparison control pattern memory to its output; and wherein said pattern selection setting means includes pattern select memory means of m channels each of which prestores three selective connection address data, said three selective connection address data of each said channel specifying which one of the outputs supplied to the inputs of each of the multiplexers of the same corresponding channels of said first, second and third multiplexer groups is to be selected in accordance with the pin arrangement of said IC.

7. The IC tester according to claim 6 wherein said pattern select memory means of m channels includes memory planes of m channels which have said selective connection address data corresponding to IC's of the same type stored at at least one common address thereof, and have said selective connection address data corresponding to IC's of another type stored at at least another common address thereof.

8. The IC tester according to claim 7 further comprising sequence control means for controlling the sequence of generating said logic test pattern in said logic test pattern generating means and the sequence of generating said memory test pattern in said memory test pattern generating means, and for providing a common read address to said memory planes of m channels during the memory test.

9. The IC tester according to claim 8 wherein said first, second and third gate means are each formed by a group of OR circuits of n channels.

10. The IC tester according to claim 8 wherein said first, second and third gate means are each formed by a group of switching circuits of n channels, said switching circuits of n channels of each group selectively outputting data inputted thereto for each channel in accordance with control signals of n channels.

11. The IC tester according to claim 9 further comprising a control signal gate group including gates of m channels each enabled and disabled by a control signal representing whether the memory test or logic test is being performed, said control signal being provided from said sequence control means, and wherein said memory planes of m channels have switching control data for said switching circuits of corresponding channels prestored at said common addresses in accordance with the type of said IC, and said switching control data of m channels being provided to said switching circuits of the corresponding channels of each of said first, second and third gate means through the gates of the corresponding channels of said control signal gate group.

12. The IC tester according to claim 2 further comprising sequence control means for controlling the sequence of generating the logic test pattern in said logic test pattern generating means and the sequence of generating the memory test pattern in said memory test pattern generating means, said sequence control means including a main sequence controller and a memory test pattern sequence controller, and wherein said main sequence controller controls the logic test pattern generating sequence of said logic test pattern generating means in accordance with a program and applies a start signal to said memory test pattern sequence controller, and said memory test pattern sequence controller responds to said start signal to control the memory test pattern generating sequence of said memory test pattern generating means in accordance with another program and, upon completion of said pattern generating sequence, applies an end signal to said main sequence controller.

13. The IC tester according to claim 12 wherein said main sequence controller includes a link controller and a logic test pattern sequence controller, said link controller applying a start signal to said memory test pattern sequence controller and said logic test pattern sequence controller, and said memory test pattern sequence controller and said logic test pattern sequence controller responding to said start signals to start said memory test pattern generating sequence and said logic test pattern generating sequence in accordance with respective programs, upon completion of said pattern generating sequences, applying end signals to said link controller.

14. The IC tester according to claim 13 wherein said pattern selection setting means is a pattern select memory which stores at different addresses a plurality of different selective connection address data each specifying the setting of selection of said memory test pattern data of m channels and said logical comparison control pattern data of m channels, and said sequence control means generates an address for accessing said pattern select memory.

15. The IC tester of claim 12 wherein said pattern selection setting means is a pattern select memory which stores at different addresses a plurality of different selective connection address data each specifying the setting of selection of said memory test pattern data of m channels and said logical comparison control pattern data of m channels, and said sequence control means generates an address for accessing said pattern select memory.

* * * * *